United States Patent [19]

Takenaka

[11] Patent Number: 4,926,373
[45] Date of Patent: May 15, 1990

[54] WORD PROCESSOR FOR SELECTING A CONTROL PROGRAM STORED IN THE WORD PROCESSOR WHEN A CONTROL PROGRAM IN AN EXTERNALLY DETACHABLE MEMORY IS NOT ABLE TO BE READ

[75] Inventor: Shunpei Takenaka, Yamato, Japan

[73] Assignee: Canon Kabushiki Kaisha, Tokyo, Japan

[21] Appl. No.: 104,540

[22] Filed: Oct. 1, 1987

Related U.S. Application Data

[63] Continuation of Ser. No. 621,693, Jun. 18, 1984, abandoned.

[30] Foreign Application Priority Data

Jun. 27, 1983 [JP] Japan ................. 58-114427

[51] Int. Cl.$^5$ ............... G06F 15/00; G06F 11/00; G06F 3/12
[52] U.S. Cl. .................... 364/900; 364/943.91; 364/964.3; 364/943.43; 364/948.1; 371/10.1; 400/76

[58] Field of Search ... 364/200 MS File, 900 MS File; 400/63, 76; 371/8.1, 10.1

[56] References Cited

U.S. PATENT DOCUMENTS

| | | | |
|---|---|---|---|
| 4,445,115 | 4/1984 | Rudgard | 340/745 |
| 4,484,302 | 11/1984 | Cason et al. | 364/900 |
| 4,491,914 | 1/1985 | Sujaku | 364/200 |
| 4,497,021 | 1/1985 | Fukuda et al. | 364/200 |
| 4,517,654 | 5/1985 | Carmean | 364/521 |
| 4,556,959 | 12/1985 | Allen et al. | 364/900 |

*Primary Examiner*—Thomas C. Lee
*Attorney, Agent, or Firm*—Fitzpatrick, Cella, Harper & Scinto

[57] ABSTRACT

A word processor includes an input keyboard for inputting characters, a ROM for storing a basic processing program for the characters inputted by the keyboard, a floppy disk for storing processing programs for the characters inputted by the keyboard, a selection unit for selecting the ROM or the floppy disk, and a control unit for controlling the apparatus in accordance with the program stored in the selected one of the ROM and the floppy disk. The selection unit selects the ROM when it is difficult to read out the program from the floppy disk.

15 Claims, 2 Drawing Sheets

WORD PROCESSOR FOR SELECTING A CONTROL PROGRAM STORED IN THE WORD PROCESSOR WHEN A CONTROL PROGRAM IN AN EXTERNALLY DETACHABLE MEMORY IS NOT ABLE TO BE READ This application is a continuation of application Ser. No. 621,693 filed Jun. 18, 1984, now abandoned.

BACKGROUND OF THE INVENTION

1. Field of the Invention

The present invention relates to a word processor for processing words under control of a program read from an exchangeable storage, and more particularly to a word processor for processing words even if there is trouble in reading the program from the exchangeable storage.

2. Description of the Prior Art

In a prior art word processor which stores a control program in an exchangeable storage, such as a floppy disc, to process words, it is not at all possible to process the words when there is a trouble in reading out the program from the storage such as the floppy disc. For example, if the floppy disc which contains a word processing program is not loaded in a disc drive or there is a fault in reading out the floppy disc, the word processor is totally inoperable.

SUMMARY OF THE INVENTION

It is an object of the present invention to provide a word processor which contains a large volume of word processing programs in an exchangeable storage such as a floppy disc and has a small capacity storage which contains a portion of the word processing programs to enable the word processor to temporarily process the words even if the exchangeable storage is not loaded or there is a failure in reading out the exchangeable storage.

DETAILED DESCRIPTION OF THE PREFERRED EMBODIMENTS

Figure 1:
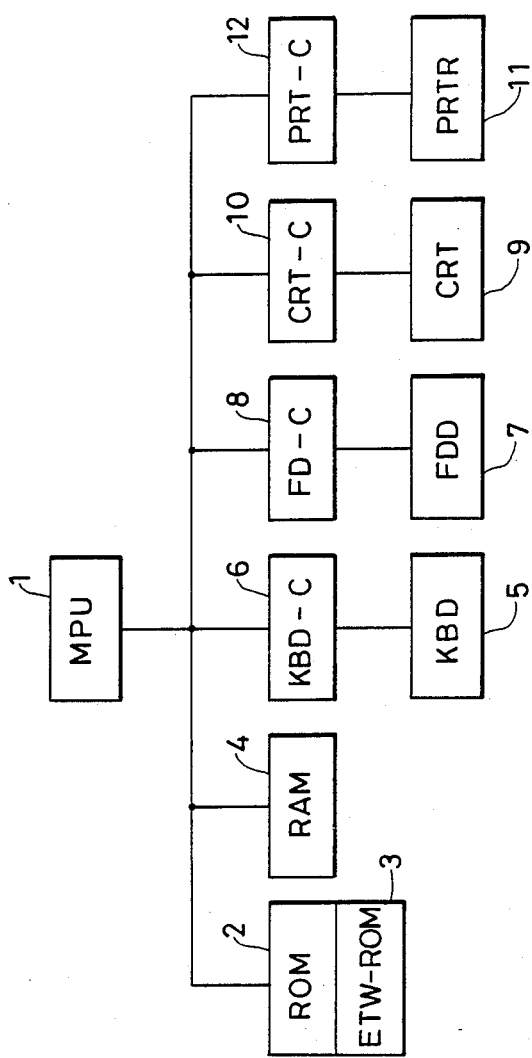
FIG. 1 is a block diagram of a configuration of a word processor of the present invention.

One embodiment of a configuration of the word processor of the present invention is shown in FIG. 1. A control unit (MPU) 1 controls a word processing operation such as information input/output or an edition for processing words in accordance with controlling and processing programs read from a read-only memory (ROM) 2 or a readable and writable memory (RAM) 4. The memory contain programs for controlling respective units of the word processor and operations of those units. A read-only memory (ETW-ROM) 3 contains a small portion of the word processing program sufficient to control only frequently used major ones of the word processings. To input information for the word processings, inputs from a keyboard (KBD) 5 are controlled by a keyboard controller (KBD-C) 6. Inputs from a floppy disc drive (FDD) 7, which reads information from an exchangeable floppy disc that contains a large volume of word processing programs sufficient to control all necessary word processings and is loaded to the floppy disc drive (FDD) 7, are controlled by a floppy disc drive controller (FD-C) 8. On the other hand, to output the information, a display output by a cathode ray tube display (CRT) 9 is controlled by a CRT controller (CRT-C) 10 and a print output by a printer (PRTR) 11 is controlled by a printer controller (PRT-C) 12.

Figure 2:
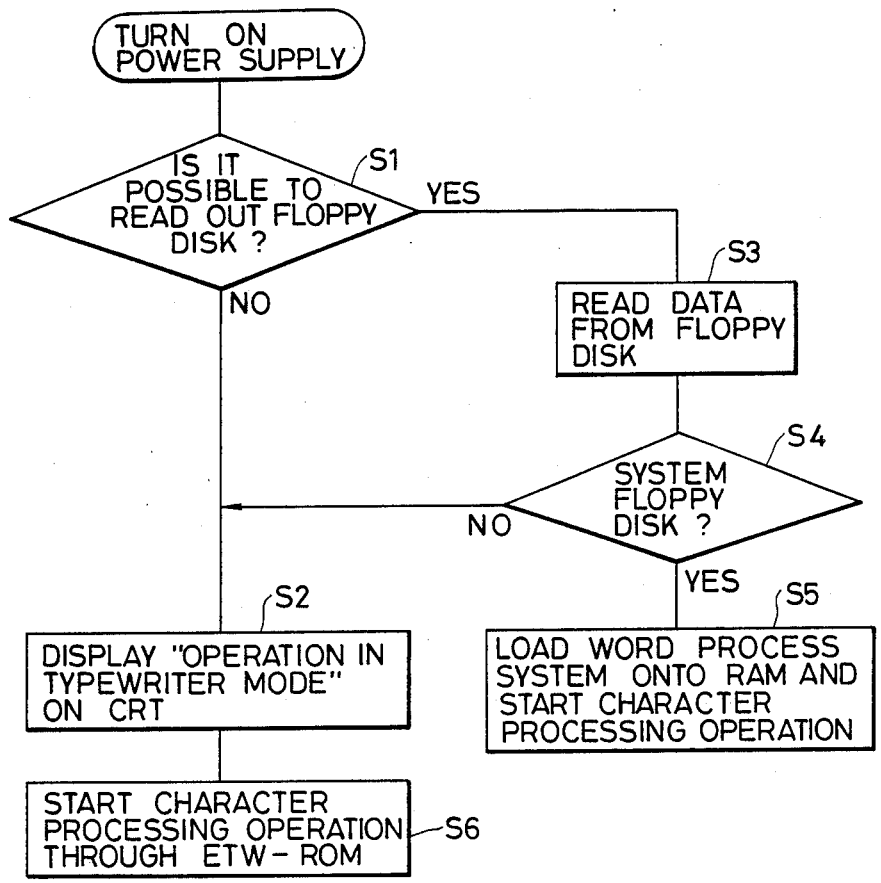
FIG. 2 is a flow chart showing an operation of the word processor.

FIG. 2 shows a flow chart illustrating a manner of a word processing operation of the word processor of the present invention. In the flow chart of FIG. 2, when a power is turned on, the control of the word processing operation is started by the control unit (MPU) 1 in accordance with the control procedures of the program stored in the read-only memory (ROM) 2. In a step S1, it is checked by the information from the floppy disc controller (FD-C) 8 whether or not the floppy disc drive (FDD) 7 is ready to read the information from the floppy disc, and if it is not ready, the program proceeds to a step S2. In the step S2, "Operation in typewriter mode" is displayed on the CRT 9, and in a step S6 the temporary word processing operation is started in accordance with the second word processing program which controls only a portion of the word processings and is stored in the read-only memory (ETW-ROM) 3. The second word processing program stored in the read-only memory (ETW-ROM) 3 is a temporary program for controlling relatively simple word processing functions such as an electronic typewriter function in which a character corresponding to a depressed key on the keyboard (KBD) 5 is outputted to the printer (PRTR) 11, and it cannot control complex word processing functions. However, it is effective to avoid stoppage of the functions of the word processor even when there is a failure in reading out the major word processing programs.

On the other hand if it is determined in the step S1 that the floppy disc drive (FDD) 7 is ready to read the floppy disc, the program proceeds to a step S3 where the data is read from the floppy disc, and in a step S4 the control unit (MPU) 1 determines if the data read from the floppy disc is the word processing program and if the floppy disc currently loaded is the word processing system floppy disc. If the data read from the floppy disc is not the word processing program, the program proceeds to the step S2 where a temporary word processing operation, similar to that carried out when the floppy disc cannot be read, is effected.

In the step S4, if it is determined that the floppy disc currently loaded is the word processing system floppy disc, the program proceeds to a step S5 where the word processing system is loaded to the writable memory (RAM) 4 and the predetermined word processing operation is started.

As described hereinabove, according to the present invention, when the system floppy disc which contains the word processing programs capable of controlling all predetermined word processings is not loaded in the word processor or the floppy disc cannot be read out because of a failure or when an address of a letter is to be printed with an increased voltage, the temporary program is read from the memory of the word processor so that the frequently used word processing operations can be carried out. Accordingly, the total stoppage of the function of the word processor is avoided.

I claim:

1. An information processing apparatus comprising: first storage means for storing a first control program for said apparatus, said first storage means being a memory device arranged in said apparatus;

second storage means being a memory device detachably mounted on said apparatus;

discrimination means for discriminating whether it is possible for a second control program to be read from said second storage means when said second storage means is mounted on said apparatus;

selection means in response to a discrimination result of said discrimination means for selecting said first storage means when it is not possible for said second control program to be read from said second storage means and for selecting said second storage means when it is possible to read said second control program therefrom;

control means, in response to the operation of said selection means, for executing one of said first and second control programs stored in one of said first and second storage means, and indicating means, responsive to said control means, for providing data indicative of one of said first control program stored in said first storage means and said second control program stored in said second storage means currently executing by said control means.

2. An information processing means according to claim 1, wherein said first storage means is a ROM and said second storage means is a floppy disc.

3. An information processing apparatus according to claim 1 further comprising:
input means for inputting characters; and
wherein said indicating means further comprises display means for displaying the characters and an indication of an operating status of said apparatus.

4. An information processing apparatus according to claim 2 further comprising:
input means for inputting characters; and wherein said indicating means further comprises display means for displaying the characters and an indication of an operating status of said apparatus.

5. An information processing apparatus according to claim 1, wherein the first control program stored in said first storage means has a typewriter function and the second control program stored in said second storage means has a word processing function.

6. An information processing means according to claim 1, further comprising third storage means for storing a third control program and wherein said selection means selects the storage means in accordance with the third control program stored in said third storage means.

7. A word processing apparatus comprising:
input means for inputting character data;
a printer for printing said character data;
memory means mounted on said apparatus for storing a first control program used for controlling printing of said character data inputted from said input means by said printer;
external memory means for storing a second control program used for controlling printing of said character data by said printer after completion of editing of said character data inputted by said input means;
discrimination means for discriminating whether it is possible to read the second control program stored in said external memory means;

processing means, responsive to said discrimination means, for processing said character data input by said input means in accordance with one of the first and second programs stored in said memory means and said external memory means; and display means, responsive to said processing means, for displaying data indicative of one of the first and second control programs stored in said memory means and said external memory means currently used for controlling processing by said processing means.

8. A word processing apparatus according to claim 7, wherein said memory means is a ROM and said external memory device is a floppy disk.

9. A word processing apparatus according to claim 7, wherein said display means is a CRT.

10. A word processing apparatus for processing character data input by a keyboard, comprising:
data read out means adapted to detachably mount an external memory device thereon for reading out data from the external memory device when the external memory device is mounted on said data read out means, wherein the external memory device stores a first word processing program for processing said character data therein;
discrimination means for discriminating whether it is possible for said word processing apparatus to read out the first word processing program used for processing said character data from said external memory device by the data read out means;
memory means for storing a second character processing program used for processing a portion of said character data by said word processing apparatus;
processing means in response to said discrimination for processing character data input by the keyboard in accordance with the second character processing program stored in said memory means when it is not possible to read the first word processing program, and
indicating means, responsive to said processing means, for providing data indicative of one of said first word processing program stored in said external memory device and said second character processing program stored in said memory means currently used for controlling processing by said processing means.

11. A word processing apparatus according to claim 10, wherein said word processing apparatus comprises printing means.

12. A word processing apparatus according to claim 10, wherein said external memory device comprises a floppy disc controller.

13. A word processing apparatus according to claim 10, wherein said word processing apparatus comprises a CRT display.

14. An information processing apparatus according to claim 1, wherein said indicating means comprises display means for displaying a message comprising at least one character.

15. A word processing apparatus according to claim 10, wherein said indicating means comprises display means for displaying a message comprising at least one character.

* * * * *

UNITED STATES PATENT AND TRADEMARK OFFICE
CERTIFICATE OF CORRECTION

PATENT NO. : 4,926,373

DATED : May 15, 1990

INVENTOR(S) : Shunpei Takenaka

It is certified that error appears in the above-identified patent and that said Letters Patent is hereby corrected as shown below:

COLUMN 1:

Line 23, "a" should be deleted;
    Line 56, "memory" should read --memories--.

COLUMN 3:

Line 36, "wherein" should read --¶ wherein--.

Signed and Sealed this

Third Day of November, 1992

*Attest:*

DOUGLAS B. COMER

*Attesting Officer*      Acting Commissioner of Patents and Trademarks